(12) United States Patent
Schulze et al.

(10) Patent No.: US 9,911,808 B2
(45) Date of Patent: Mar. 6, 2018

(54) METHOD FOR FORMING A SEMICONDUCTOR DEVICE AND A SEMICONDUCTOR DEVICE

(71) Applicant: Infineon Technologies AG, Neubiberg (DE)

(72) Inventors: Hans-Joachim Schulze, Taufkirchen (DE); Philipp Seng, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/413,579

(22) Filed: Jan. 24, 2017

(65) Prior Publication Data

US 2017/0229539 A1   Aug. 10, 2017

(30) Foreign Application Priority Data

Feb. 5, 2016   (DE) .................. 10 2016 102 070

(51) Int. Cl.
*H01L 21/00* (2006.01)
*H01L 21/425* (2006.01)
(Continued)

(52) U.S. Cl.
CPC .... *H01L 29/0684* (2013.01); *H01L 21/26513* (2013.01); *H01L 21/326* (2013.01); *H01L 29/0615* (2013.01); *H01L 29/1095* (2013.01); *H01L 29/167* (2013.01); *H01L 29/36* (2013.01); *H01L 29/66136* (2013.01); *H01L 29/66333* (2013.01); *H01L 29/66666* (2013.01); *H01L 29/7395* (2013.01); *H01L 29/7827* (2013.01); *H01L 29/861* (2013.01)

(58) Field of Classification Search
CPC ................ H01L 21/26513; H01L 29/0684; H01L 29/36
USPC .................... 438/68, 528; 257/329
See application file for complete search history.

(56) References Cited

U.S. PATENT DOCUMENTS 5,356,829 A   10/1994 Willman
8,895,418 B2   11/2014 Irsigler et al.
(Continued)

FOREIGN PATENT DOCUMENTS

DE        4035628 C2    6/1999
DE   102011052605 A1    2/2013
(Continued)

*Primary Examiner* — David S Blum
(74) *Attorney, Agent, or Firm* — Slater Matsil, LLP (57) ABSTRACT

A method for forming a semiconductor device includes incorporating first dopant atoms of a first conductivity type into a semiconductor substrate to form a first doping region of the first conductivity type. Further, the method includes forming an epitaxial semiconductor layer on the semiconductor substrate and incorporating second dopant atoms of a second conductivity type before or after forming the epitaxial semiconductor layer to form a second doping region including the second conductivity type adjacent to the first doping region so that a pn-junction is located between the first doping region and the second doping region. The pn-junction is located in a vertical distance of less than 5 μm to an interface between the semiconductor substrate and the epitaxial semiconductor layer. Additionally, the method includes thinning the semiconductor substrate based on a self-aligned thinning process. The self-aligned thinning process is self-controlled based on the location of the pn-junction.

20 Claims, 8 Drawing Sheets

(51) Int. Cl.
  *H01L 29/76*    (2006.01)
  *H01L 29/94*    (2006.01)
  *H01L 31/062*   (2012.01)
  *H01L 31/113*   (2006.01)
  *H01L 31/119*   (2006.01)
  *H01L 29/06*    (2006.01)
  *H01L 21/265*   (2006.01)
  *H01L 21/326*   (2006.01)
  *H01L 29/10*    (2006.01)
  *H01L 29/167*   (2006.01)
  *H01L 29/36*    (2006.01)
  *H01L 29/66*    (2006.01)
  *H01L 29/739*   (2006.01)
  *H01L 29/78*    (2006.01)
  *H01L 29/861*   (2006.01)

(56) References Cited

U.S. PATENT DOCUMENTS

| 8,975,136 B2 | 3/2015 | Willmeroth et al. |
| 2015/0064890 A1 | 3/2015 | Schulze et al. |

FOREIGN PATENT DOCUMENTS

| DE | 102014101937 A1 | 8/2014 |
| DE | 102014112386 A1 | 3/2015 |

METHOD FOR FORMING A SEMICONDUCTOR DEVICE AND A SEMICONDUCTOR DEVICE

CROSS-REFERENCE TO RELATED APPLICATIONS

This application claims priority to German Patent Application No. 102016102070.2, filed on Feb. 5, 2016, which application is hereby incorporated herein by reference.

TECHNICAL FIELD

Embodiments relate to concepts for thinning semiconductor substrates and in particular to a method for forming a semiconductor device and a semiconductor device.

BACKGROUND

The accuracy of the thickness of the semiconductor substrate of semiconductor devices is important for various devices. Especially vertical semiconductor devices for high voltages may be sensitive to variations of the thickness of the semiconductor substrate. In particular with IGBTs (insulated gate bipolar transistor) such an exact thinning is very important to enable a reproducible electrical performance. For example, robustness against destruction by short-circuit current may very sensibly depend (e.g. for peak-shaped field stop zones) on the distance between the back-side emitter and the first field stop peak (seen from the back side), or with Gaussian field stop profiles on the electrically active field stop dosage remaining after thinning.

SUMMARY

There may be a demand for providing a concept for forming semiconductor devices, which enables an improvement of the robustness and/or reliability of semiconductor devices.

Such a demand may be satisfied by the subject matter of the claims.

Some embodiments relate to a method for forming a semiconductor device comprising incorporating first dopant atoms of a first conductivity type into a semiconductor substrate to form a first doping region comprising the first conductivity type. Further, the method comprises forming an epitaxial semiconductor layer on the semiconductor substrate and incorporating second dopant atoms of a second conductivity type before or after forming the epitaxial semiconductor layer to form a second doping region comprising the second conductivity type adjacent to the first doping region so that a pn-junction is located between the first doping region and the second doping region. The pn-junction is located in a vertical distance of less than 5 µm to an interface between the semiconductor substrate and the epitaxial semiconductor layer. Additionally, the method comprises thinning the semiconductor substrate based on a self-aligned thinning process. The self-aligned thinning process is self-controlled based on the location of the pn-junction.

Some embodiments relate to a semiconductor device comprising at least one vertical electrical element structure formed at a semiconductor substrate. The at least one vertical electrical element structure comprises a doping region having a second conductivity type located between a front side and a back side of the semiconductor substrate. Further, the doping region extends vertically at least from a distance of less than 2 µm from the back side of the semiconductor substrate to a distance of more than 2 µm from the back side of the semiconductor substrate. Additionally, the semiconductor device comprises at least one front side electrode structure connected to the at least one vertical electrical element structure at a front side of the semiconductor substrate and at least one back side electrode structure connected to the at least one vertical electrical element structure at a back side of the semiconductor substrate. Further, a concentration of dopant atoms of a first conductivity type at a distance of 2 µm from the back side of the semiconductor substrate is larger than $5*10^{13}$ cm$^{-3}$.

BRIEF DESCRIPTION OF THE DRAWINGS

Some embodiments of apparatuses and/or methods will be described in the following by way of example only, and with reference to the accompanying figures, in which.

DETAILED DESCRIPTION OF ILLUSTRATIVE EMBODIMENTS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
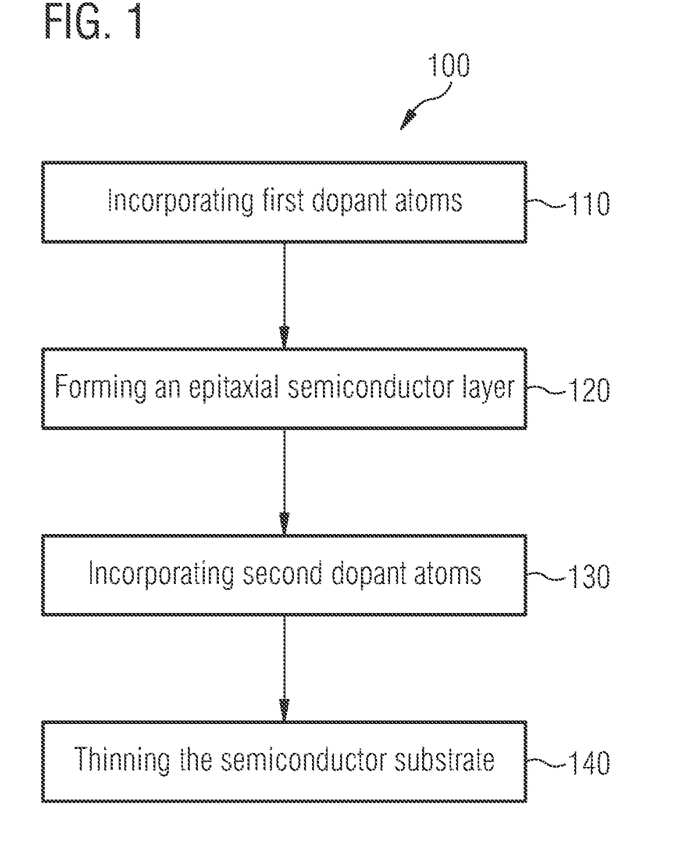
FIG. 1 shows a flow chart of method for forming a semiconductor device.

FIG. 1 shows a method for forming a semiconductor device according to an embodiment. The method 100 comprises incorporating no first dopant atoms of a first conductivity type into a semiconductor substrate to form a first doping region comprising the first conductivity type. Further, the method 100 comprises forming 120 an epitaxial semiconductor layer on the semiconductor substrate and incorporating 130 second dopant atoms of a second conductivity type before or after forming 120 the epitaxial semiconductor layer to form a second doping region comprising the second conductivity type adjacent to the first doping region so that a pn-junction is located between the first doping region and the second doping region. The pn-junction is located in a vertical distance of less than 5 µm to an interface between the semiconductor substrate and the epitaxial semiconductor layer. Additionally, the method 100 comprises thinning 140 the semiconductor substrate based on a self-aligned thinning process. The self-aligned thinning process is self-controlled based on the location of the pn-junction.

Due to the incorporation of two different dopants of different conductivity type forming a pn-junction in the proximity of the boundary between the semiconductor substrate and the epitaxial semiconductor layer, the position of the pn-junction may be very constant during the remaining manufacturing processes of the semiconductor device. Therefore, the accuracy of the thinning of the semiconductor substrate may be improved, when using a self-aligned thinning process, which stops at the pn-junction or a depletion zone caused by the pn-junction. In this way, the robustness and/or reliability of semiconductor device to be formed may be improved.

Dopant atoms of the first conductivity type may be atoms representing an acceptor (e.g., boron or indium) in a semiconductor substrate or atoms representing a donor (e.g., phosphorus) in a semiconductor substrate, if electrically activated (e.g., by annealing). Consequently, dopant atoms of the second conductivity type indicate an opposite donor or acceptor. In other words, dopant atoms of the first conductivity type may represent acceptors and dopant atoms of the second conductivity type may represent donors (e.g., which may be used for the proposed self-aligned thinning) or vice versa.

For example, a diffusion coefficient of the first dopant atoms within the semiconductor substrate differs from a diffusion coefficient of the second dopant atoms within the semiconductor substrate by less than 50% of the diffusion coefficient of the first dopant atoms within the semiconductor substrate (e.g., in a temperature range of 1000° C. to 1200° C. for silicon or between 1050° C. and 1150° C.). Consequently, the distribution profile of the first dopant atoms and the distribution profile of the second dopant atoms may be altered similarly during the manufacturing of the semiconductor device due to the applied thermal budget. In this way, the position of the pn-junction may be very stable. For example, the first dopant atoms are boron atoms (or indium atoms) and the second dopant atoms are phosphorus atoms.

The first dopant atoms may be incorporated no (e.g., implanted or diffused) into the semiconductor substrate through a front side surface of the semiconductor substrate. The front side surface of the semiconductor substrate may be uncovered or unmasked during the incorporation no of the first dopant atoms so that the vertical distribution profile is laterally substantially constant. The first dopant atoms may be incorporated no laterally over the whole semiconductor substrate (or more than 70% or more than 90% of the semiconductor substrate). The first dopant atoms may be incorporated no with a dopant dose of more than $1*10^{12}$ cm$^{-2}$ (or more than $1*10^{13}$ cm$^{-2}$ or more than $1*10^{14}$ cm$^{-2}$ or between $1*10^{12}$ cm$^{-2}$ and $1*10^{15}$ cm$^{-2}$ or between $1*10^{13}$ cm$^{-2}$ and $5*10^{14}$ cm$^{-2}$). For example, the first doping region may comprise a maximal doping concentration of more than $1*10^{15}$ cm$^{-3}$ (or more than $1*10^{16}$ cm$^{-3}$ or more than $1*10^{17}$ cm$^{-3}$).

The second dopant atoms may be incorporated 130 (e.g., implanted or diffused) into the semiconductor substrate through a front side surface of the semiconductor substrate before forming 120 the epitaxial semiconductor layer or may be incorporated 130 into the epitaxial semiconductor layer through a front side surface of the epitaxial semiconductor layer (and optionally also partly into the semiconductor substrate beneath the epitaxial semiconductor layer, if the penetration depth of the second dopants is larger than a thickness of the epitaxial semiconductor layer) after forming 120 the epitaxial semiconductor layer. The front side surface of the semiconductor substrate may be uncovered or unmasked during the incorporation 130 of the second dopant atoms, if the second dopants are incorporated before the epitaxial semiconductor layer is formed 120. Alternatively, the front side surface of the epitaxial semiconductor layer may be uncovered or unmasked during the incorporation 130 of the second dopant atoms, if the second dopants are incorporated after the epitaxial semiconductor layer is formed 120. The second dopant atoms may be incorporated 130 with a dopant dose of more than $1*10^{12}$ cm$^{-2}$ (or more than $1*10^{13}$ cm$^{-2}$ or more than $1*10^{14}$ cm$^{-2}$ or between $1*10^{12}$ cm$^{-2}$ and $1*10^{15}$ cm$^{-2}$ or between $1*10^{13}$ cm$^{-2}$ and $5*10^{14}$ cm$^{-2}$). For example, the second doping region may comprise a maximal doping concentration of more than $1*10^{15}$ cm$^{-3}$ (or more than $1*10^{16}$ cm$^{-3}$ or more than $1*10^{17}$ cm$^{-3}$).

For example, a dopant dose of the first dopant atoms and a dopant dose of the second dopant atoms may differ by less than 10% (or less than 5% or even less than 2%) of the dopant dose of the first dopant atoms. In this way, the position of the pn-junction may be very stable. Further, a concentration of dopant atoms of the first conductivity type and a concentration of dopant atoms of the second conductivity type at the pn-junction may be higher than $1*10^{14}$ cm$^{-3}$ (or higher than 5*10$^{14}$ cm$^{-3}$, higher than 1*10$^{15}$ cm$^{-3}$ or higher than 1*10$^{16}$ cm$^{-3}$), for example, at a time directly before the thinning of the semiconductor substrate by the self-aligned thinning process. For example, the higher the concentration, the exactor the etch stop will be because the etch process may stop as soon as the etched surfaces reaches the boundary of the space charge region, which is closer to the etched wafer side.

For example, a distance between a maximum of the vertical distribution of the first dopant atoms and a maximum of the vertical distribution of the second dopant atoms may be between 500 nm and 5 μm (or between 1 μm and 4 μm). For example, the first dopant atoms are incorporated by a first implantation process and the second dopant atoms are incorporated by a second implantation and an end of range of the first implantation process and an end of range of the second implantation may be spaced apart from each other by less than 10 μm (or less than 5 μm or less than 3 μm) and/or by more than 200 nm (or more than 500 nm or more than 1 μm).

The second doping region is formed adjacent to the first doping region so that a pn-junction is located between the first doping region and the second doping region. The pn-junction may occur at least after electrically activating (e.g., by an additional annealing process or automatically during succeeding processes for forming the semiconductor device) the first dopant atoms and the second dopants. The incorporation no of the first dopant atoms and the incorporation 130 of the second dopant atoms are performed so that the pn-junction is located in a vertical distance of less than 5 μm (or less than 3 μm or less than 1 μm) to an interface between the semiconductor substrate and the epitaxial semiconductor layer. This may be done by implanting with different energies and/or implanting with different implant angles, if the second dopants are incorporated 130 before the epitaxial semiconductor layer is formed 120, or by implanting with different energies, implanting with different implant angles and/or the deposition of the epitaxial semiconductor layer with a corresponding thickness, if the second dopants are incorporated 130 after the epitaxial semiconductor layer is formed 120, for example. For example, a vertical position of the pn-junction varies during forming the semiconductor device (e.g., due to the thermal budget applied to the doping regions) by less than 2 μm (or less than 1 μm or less than 500 nm).

The epitaxial semiconductor layer may be formed 120 by an epitaxial deposition process and may comprise the same material as the semiconductor substrate (e.g., a different base doping may be incorporated). The epitaxial semiconductor layer may be deposited on the front side surface of the semiconductor substrate.

For example, the epitaxial semiconductor layer may be an intermediate epitaxial semiconductor layer used for controlling the differing desired depths of the incorporation no of the first dopant atoms and the incorporation 130 of the second dopant atoms. Alternatively, the epitaxial semiconductor layer may be used for implementing at least a drift region and/or field stop region of a vertical electrical element structure of the semiconductor device to be formed.

In the first case (epitaxial semiconductor layer is formed before incorporating the second dopant atoms), the epitaxial semiconductor layer may comprise a thickness of less than 10 μm (or less than 5 μm or less than 3 μm). Additionally, a second epitaxial semiconductor layer may be formed on the first (intermediate) epitaxial semiconductor layer after incorporating the second dopant atoms. The second epitaxial semiconductor layer may comprise a thickness of more than 10 μm (or more than 30 μm or more than 50 μm) and may be used for implementing at least a drift region and/or field stop region of a vertical electrical element structure of the semiconductor device to be formed.

In the second case (epitaxial semiconductor layer is formed after incorporating the second dopant atoms), the epitaxial semiconductor layer may comprise a thickness of more than 10 μm (or more than 30 μm or more than 50 μm) and may be used for implementing at least a drift region and/or field stop region.

Various additional processes depending on the type of semiconductor device to be formed may be performed after incorporating 130 the second dopant atoms and before thinning 140 the semiconductor substrate. For example, at least a part of a vertical transistor structure (e.g., gate, source region, body region, gate electrode structure, and/or source electrode structure) or vertical diode structure (e.g., anode or cathode structure at front side of semiconductor substrate) may be formed after incorporating the second dopant atoms and before thinning the semiconductor substrate. For example, the vertical transistor structure or vertical diode structure as well as the semiconductor device to be formed may comprises a blocking voltage of more than 10V, more than 100 V, more than 500 V or more than 1000 V.

At least part of the thinning 140 of the semiconductor substrate is performed by a self-aligned thinning process. A self-aligned thinning process may be a thinning process, which automatically stops or significantly decelerates the thinning speed based on the influence of a property of the semiconductor device itself instead of pure control of the thinning time. For example, properties influencing the etching speed may be used for a self-aligned control of a thinning process. For example, the speed of thinning of a thinning process (e.g., electro-chemical etching process) may be significantly reduced, if a pn-junction or the depletion zone of a pn-junction is reached. For example, the self-aligned thinning process may be an electro-chemical etching process, which stops or significantly decelerates the etch rate when reaching the pn-junction or the depletion zone of the pn-junction between the first doping region and the second doping region. In this example, the self-aligned thinning process is self-controlled based on the location of the pn-junction. Optionally, an external electrical potential is applied to at least the second doping region during thinning 140 of the semiconductor substrate to increase the accuracy of the thinning. The external electrical potential may be applied to a contact interface (e.g., pad) located within a kerf, for example.

Additional, the thinning 140 of the semiconductor substrate may comprise further sub-processes. For example, the thinning 140 of the semiconductor substrate may comprise grinding of the semiconductor substrate before performing the self-aligned thinning process. Further, an additional short, time-controlled etching process may be performed after the self-aligned thinning process to remove remaining portions of the semiconductor substrate, for example. Portions of the semiconductor substrate may remain after the self-aligned thinning process, since the self-aligned thinning process may stop at the depletion zone of the pn-junction and not at the pn-junction itself. The error due to the short, time-controlled etching process may be very low, since the short, time-controlled etching process may be significantly shorter than the self-aligned thinning process. For example, the short, time-controlled etching process may be performed for less than 20% (or less than 10% or less than 5%) of a process time of the self-aligned thinning process.

After thinning 140 of the semiconductor substrate, various further processes (e.g., back side processes) may be performed to finish the manufacturing of the semiconductor device. For example, a field stop region may be implemented and/or a back side doping region (e.g., emitter or drain doping region) and/or a back side metallization may be formed. The field stop region may be implemented by using at least a part of the second doping region. For example, at least a part of the second dopant atoms are used to form a field stop region of a vertical electrical device of the semiconductor device. An additional field stop implant may be performed from the back side.

A region comprising the first conductivity type may be an n-doped region (e.g., caused by incorporating nitrogen N ions, phosphorus P ions or arsenic As ions) or a p-doped region (e.g., caused by incorporating aluminum Al ions or boron B ions). Consequently, the second conductivity type indicates an opposite p-doped region or n-doped region. In other words, the first conductivity type may indicate a p-doping and the second conductivity type may indicate an n-doping or vice-versa.

The semiconductor substrate may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer. The semiconductor substrate may comprise a thickness of more than 500 µm before thinning 140 the semiconductor substrate. For example, the semiconductor substrate comprises an electrical resistivity of more than 5 Ω/cm (or more than 30 Ωcm or more than 50 Ωcm) before incorporating no the first dopant atoms and may be p-doped due to the self-adjusted thinning by electrochemical etching, which stops at the boundary of the space charge region, which is closer to the etched wafer side, for example.

A front side surface of the semiconductor substrate may be a surface of the semiconductor substrate towards metal layers, insulation layers and/or passivation layers on top of the surface of the substrate. For example, a semiconductor substrate front side may be the side at which active elements of the chip are formed. For example, more complex structures may be located at the chip front side than at the chip back side.

Figure 2A:
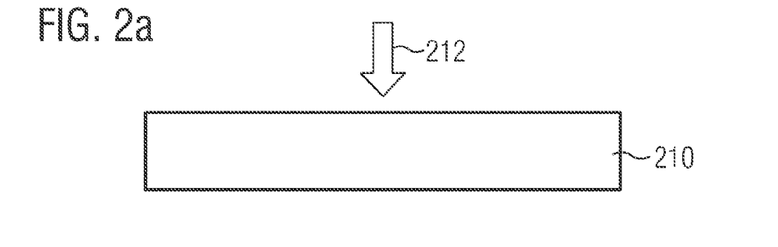
FIGS. 2A-2E show schematic cross sections of a semiconductor device at different stages of manufacturing.
Figure 2B:
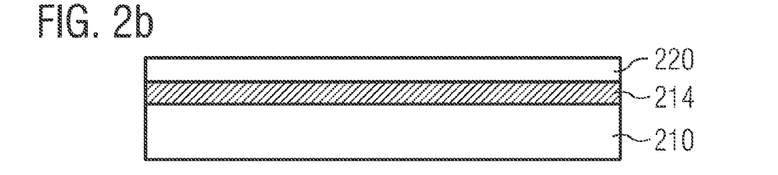

FIGS. 2A-2E show schematic cross sections of a semiconductor device at different stages of manufacturing. A semiconductor substrate 210 (e.g., wafer), which may be p-doped, is provided and boron 212 is implanted into the semiconductor substrate 210 during a first implantation process as shown in FIG. 2A to form a first doping region 214. The first doping region 214 may be a region of the semiconductor substrate with a dopant concentration higher (e.g., more than 2 times the base doping) than the base doping of the semiconductor substrate. Afterwards, a new layer 220 (intermediate epitaxial semiconductor layer) is deposited with a thickness of approximately 3 µm as shown in FIG. 2B.

Figure 2C:
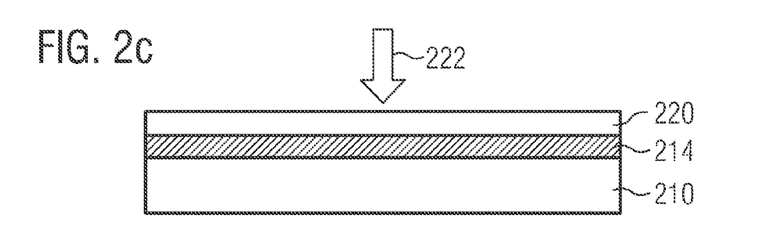
Figure 2D:
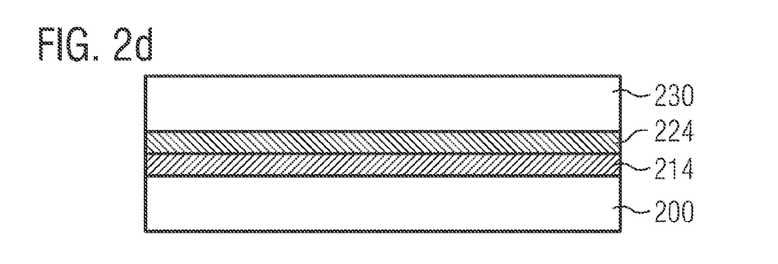
Figure 2E:
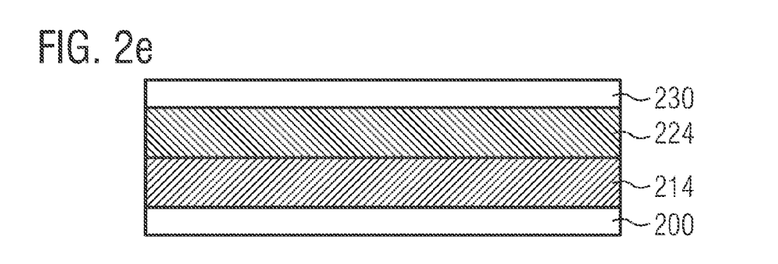

Then, phosphorous 222 is implanted into the intermediate epitaxial semiconductor layer 220 during a second implantation process as shown in FIG. 2C to form a second doping region 224. The second doping region 224 may be a region of the semiconductor substrate 210 and/or the intermediate epitaxial semiconductor layer 220 with a dopant concentration higher (e.g., more than 2 times the base doping) than the base doping of the semiconductor substrate and/or the intermediate epitaxial semiconductor layer 220. Afterwards, a device drift zone 230 (epitaxial drift region) is deposited during a second deposition process as shown in FIG. 2D. FIG. 2E shows the first doping region 214 and the second doping region 224 after applying a thermal budget. The thermal budget may be the sum of all temperature processes performed before thinning of the semiconductor substrate (e.g., processes for forming the front side structures of the device).

For example, FIGS. 2A-2E show implantations of boron and phosphorous at 100 keV with a layer (deposition) between the first implant and the second implant.

The method shown in FIGS. 2A-2E may be implemented by using process parameters mentioned above (e.g., FIG. 1) or below (e.g., FIG. 3A or 3B)

More details and aspects are mentioned in connection with the embodiments described above or below. The embodiments shown in FIGS. 2A-2E may comprise one or more optional additional features corresponding to one or more aspects mentioned in connection with the proposed concept or one or more embodiments described above (e.g., FIG. 1) or below (FIGS. 3A to 6).

Figure 3A:
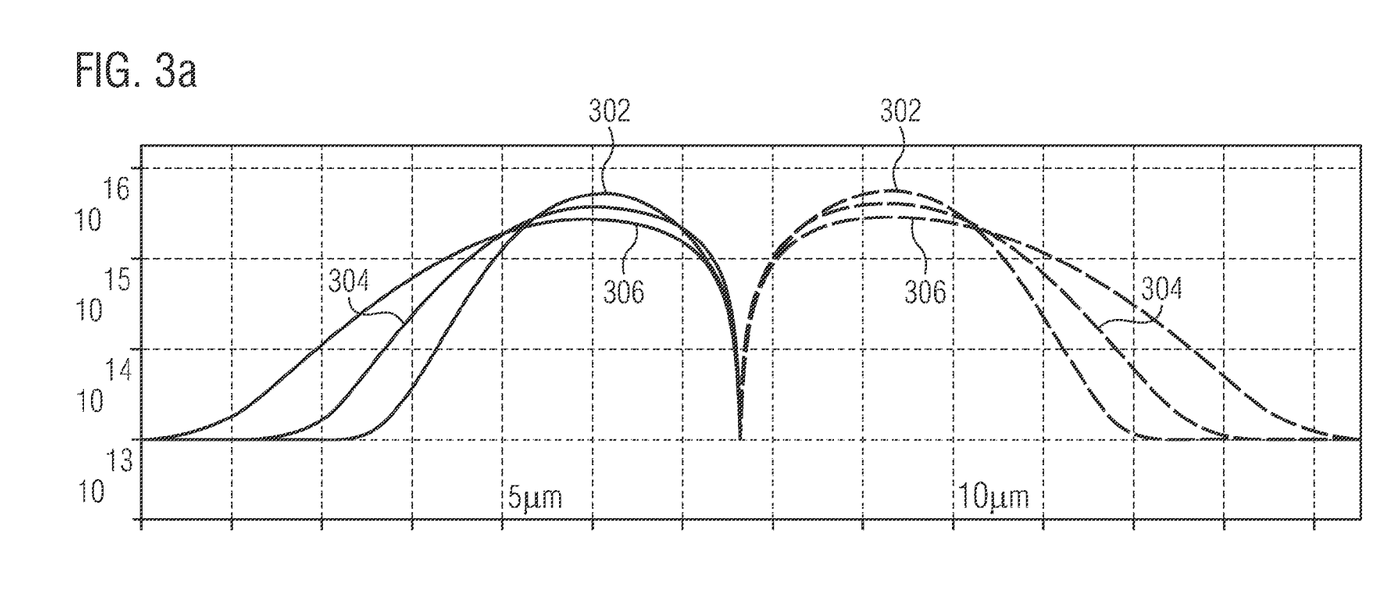
FIG. 3A shows schematic doping profiles of semiconductor devices before thinning of the semiconductor substrate for three different diffusion times.

FIG. 3A shows schematic doping profiles of semiconductor devices before thinning of the semiconductor substrate for three different diffusion times. In this example, an intermediate epitaxial semiconductor layer is located between the semiconductor substrate (right side of figure) and an epitaxial drift region (left side of figure; not fully shown). The intermediate epitaxial semiconductor layer is deposited after a first implant (e.g., of acceptors) and the drift region is deposited after a second implant (e.g., of donors). The substrate surface (interface between semiconductor substrate and the intermediate epitaxial semiconductor layer) is located at 8 µm in FIG. 3A. The thickness of the (intermediate) epitaxial layer deposited after the first implantation is 3 µm. In this example, the implantation and diffusion parameters are selected so that the profile 302 with the highest peak is obtained with a temperature budget of 200 min at 1100° C., the profile 304 with the middle peak is obtained with a temperature budget of 400 min at 1100° C. and the profile 306 with the shallow, wide peak is obtained with a temperature budget of 800 min at 1100° C. The substrate comprises a base doping of $1*10^{13}$ cm$^{-3}$. Further, the intermediate epitaxial semiconductor layer and the epitaxial drift region are deposited with a doping concentration of $1*10^{13}$ cm$^{-3}$. The first implant is done with a dose of $1*10^{12}$ cm$^{-2}$ at 100 keV and the second implant is done with a dose of $1*10^{12}$ cm$^{-2}$ at 100 keV. The pn-junction is (almost) stable for all selected diffusion times.

Figure 3B:
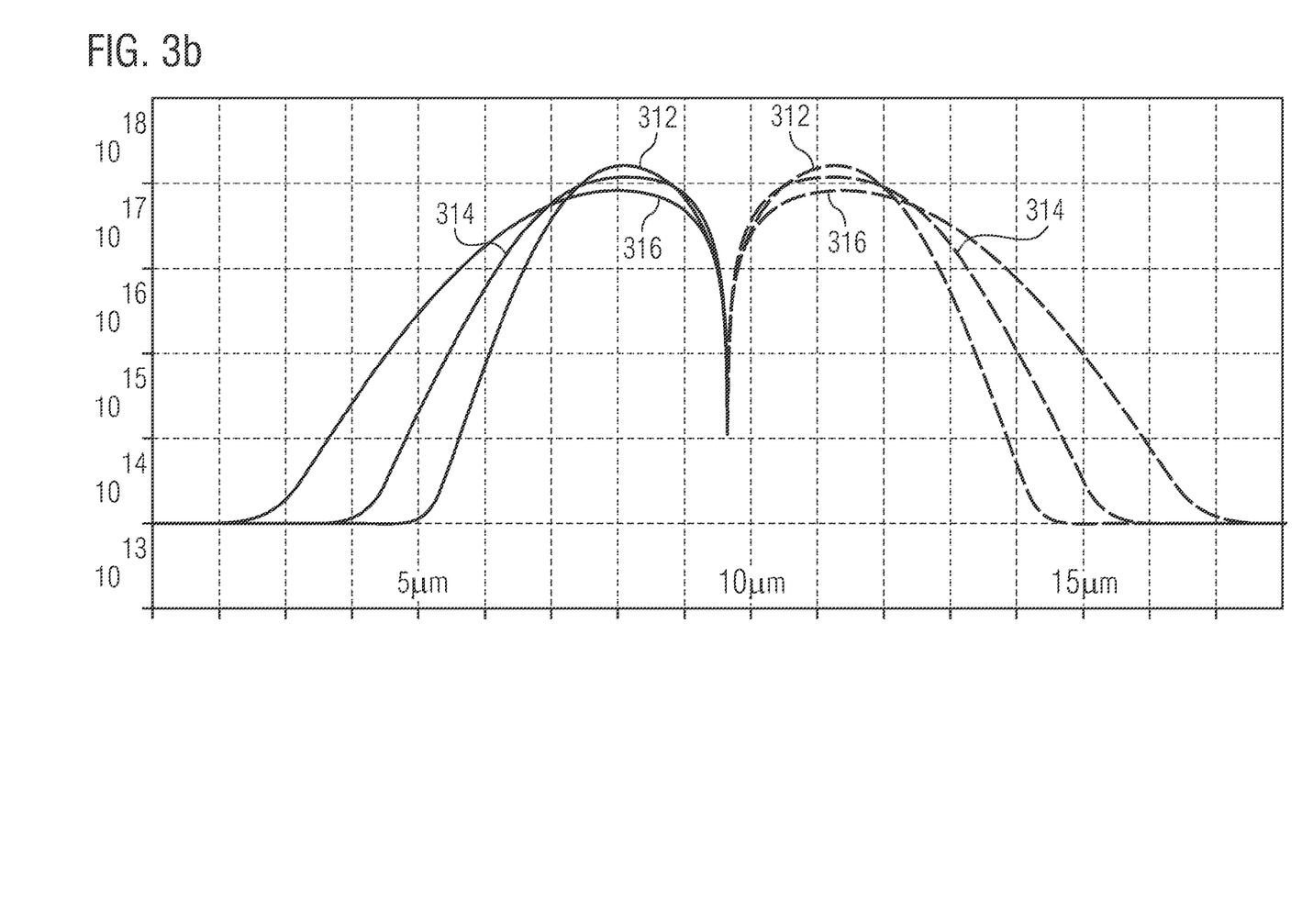
FIG. 3B shows schematic doping profiles of further semiconductor devices before thinning of the semiconductor substrate for three different diffusion times.

FIG. 3B shows schematic doping profiles of further semiconductor devices before thinning of the semiconductor substrate for three different diffusion times. In comparison to the example shown in FIG. 3A, in the example of FIG. 3B the first implant and the second implant are done with a dose of $3*10^{12}$ cm$^{-2}$. Further, the substrate surface is located at 10 µm. The profile 312 with the highest peak is obtained with a temperature budget of 200 min at 1100° C., the profile 314 with the middle peak is obtained with a temperature budget of 400 min at 1100° C. and the profile 316 with the shallow, wide peak is obtained with a temperature budget of 800 min at 1100° C. The pn-junction is (almost) stable for all selected diffusion times.

Figure 3C:
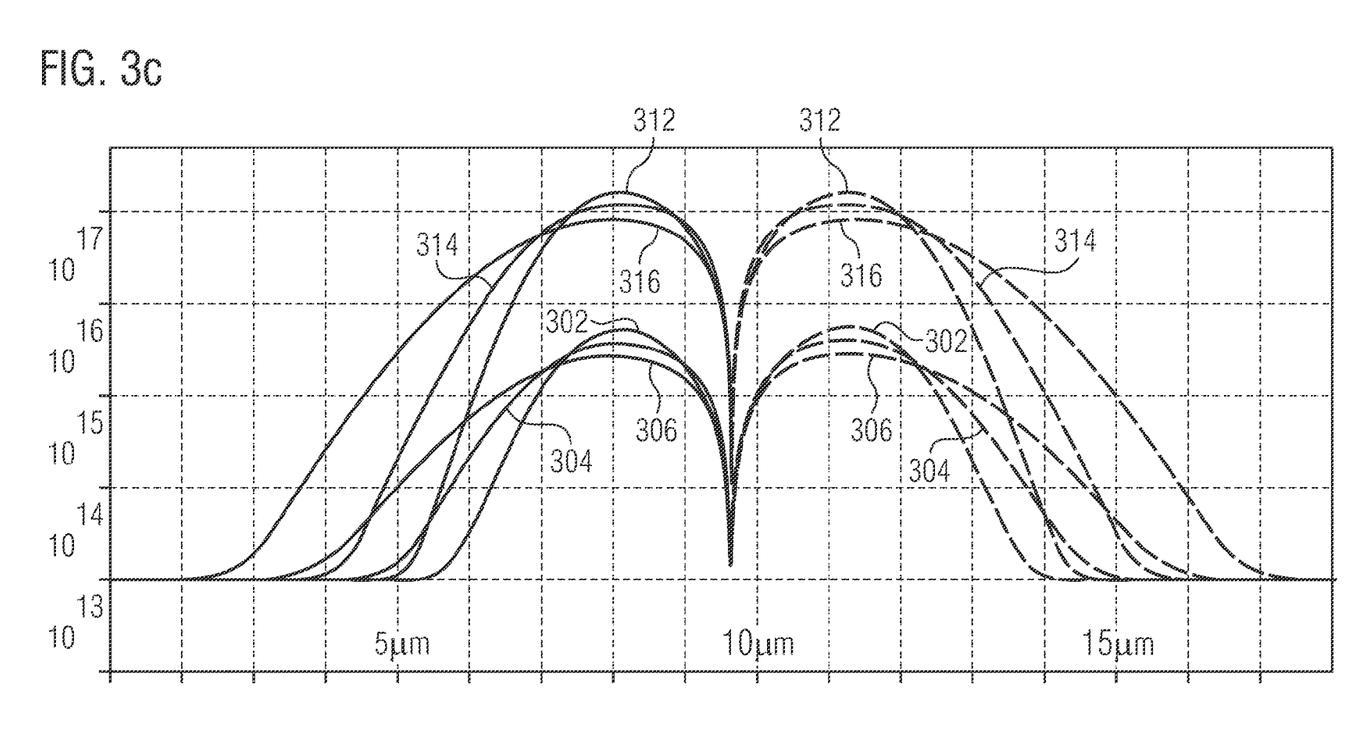
FIG. 3C shows a comparison of the doping profiles of FIGS. 3A and 3B.

FIG. 3C shows a comparison of the doping profiles of FIGS. 3A and 3B. The doping profile of FIG. 3A was shifted for this comparison so that the substrate-epi-interface is located at 10 µm for both doping profiles.

Figure 4A:
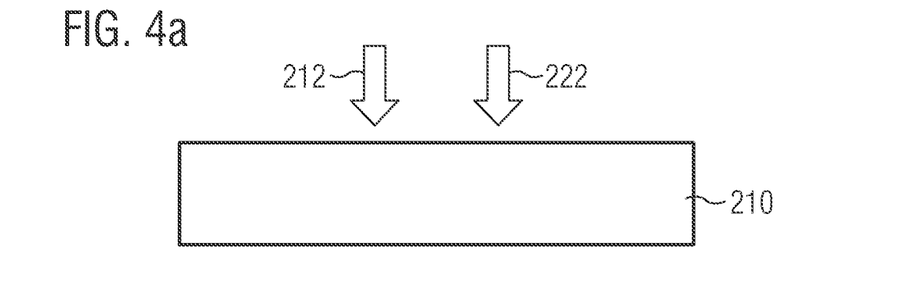
FIGS. 4A-4C show schematic cross sections of a semiconductor device at different stages of manufacturing.
Figure 4B:
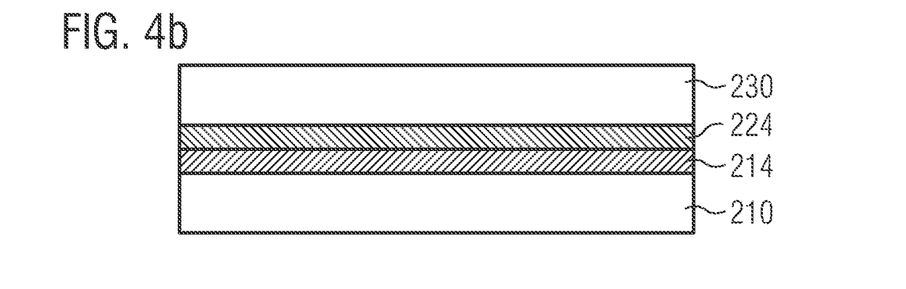
Figure 4C:
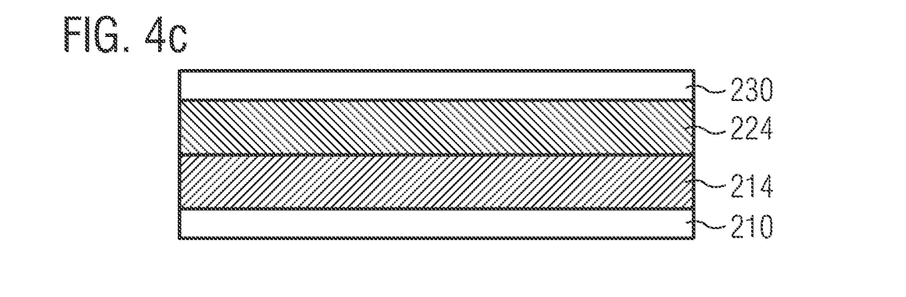

FIGS. 4A-4C show schematic cross sections of a semiconductor device at different stages of manufacturing. A semiconductor substrate 210 (e.g., wafer) is provided and boron 212 is implanted into the semiconductor substrate during a first implantation process as shown in FIG. 2A to form a first doping region 214. The first doping region 214 may be a region of the semiconductor substrate with a dopant concentration higher (e.g., more than 2 times the base doping) than the base doping of the semiconductor substrate (e.g., p-doped).

Then, phosphorous 222 is implanted into the semiconductor substrate 210 during a second implantation process as shown in FIG. 4A to form a second doping region 224. The second doping region 224 may be a region of the semiconductor substrate 210 with a dopant concentration higher (e.g., more than 2 times the base doping) than the base doping of the semiconductor substrate and a concentration of boron caused by the distribution of dopants of the first implant process. The second implantation process may be performed directly after the boron implantation or at least while the surface of the semiconductor substrate is uncovered as for the boron implantation. The boron and the phosphorous are implanted with different implant energies (e.g., boron at 700 keV and at phosphorous 50 keV) to form the first and second doping region in different depths of the semiconductor substrate 210. Afterwards, a device drift zone 230 (epitaxial drift region) is deposited as shown in FIG. 4B. FIG. 4B is a schematic illustration. For example, the thickness of the drift zone is much larger (e.g., more than a factor of 3, more than a factor of 5, more than a factor of 10 or even more than a factor of 30) compared to the thickness of the first doping region 214 and/or the second doping region 224 after performing all high-temperature processes. FIG. 4C shows the first doping region 214 and the second doping region 224 after applying a thermal budget. The thermal budget may be the sum of all temperature processes performed before thinning of the semiconductor substrate (e.g., processes for forming the front side structures of the device).

For an example with a 700 keV boron implant, a 50 keV phosphorous implant and without an intermediate epitaxy (e.g., compared to the intermediate epitaxial semiconductor layer shown in FIGS. 2A-2E), the position of the pn-junction may be shifted by 0.3 µm for a thermal budget between 200 minutes at 1100° C. and 800 minutes at 1100° C. (see FIG. 5).

For example, FIGS. 4A-4C show both implantations with different energies and only an epitaxial drift zone layer (in comparison to FIG. 2A-2E). FIGS. 4A-4C show an alternative process with respect to FIGS. 2A-2E. Both implantations are performed at the beginning and lower accuracy (of the position of the pn-junction) of approximately 0.3 µm may be obtained (e.g., see FIG. 5).

More details and aspects are mentioned in connection with the embodiments described above or below. The embodiments shown in FIGS. 4A-4C may comprise one or more optional additional features corresponding to one or more aspects mentioned in connection with the proposed concept or one or more embodiments described above (e.g., FIG. 1 to 3C) or below (FIGS. 5 to 6).

Figure 5:
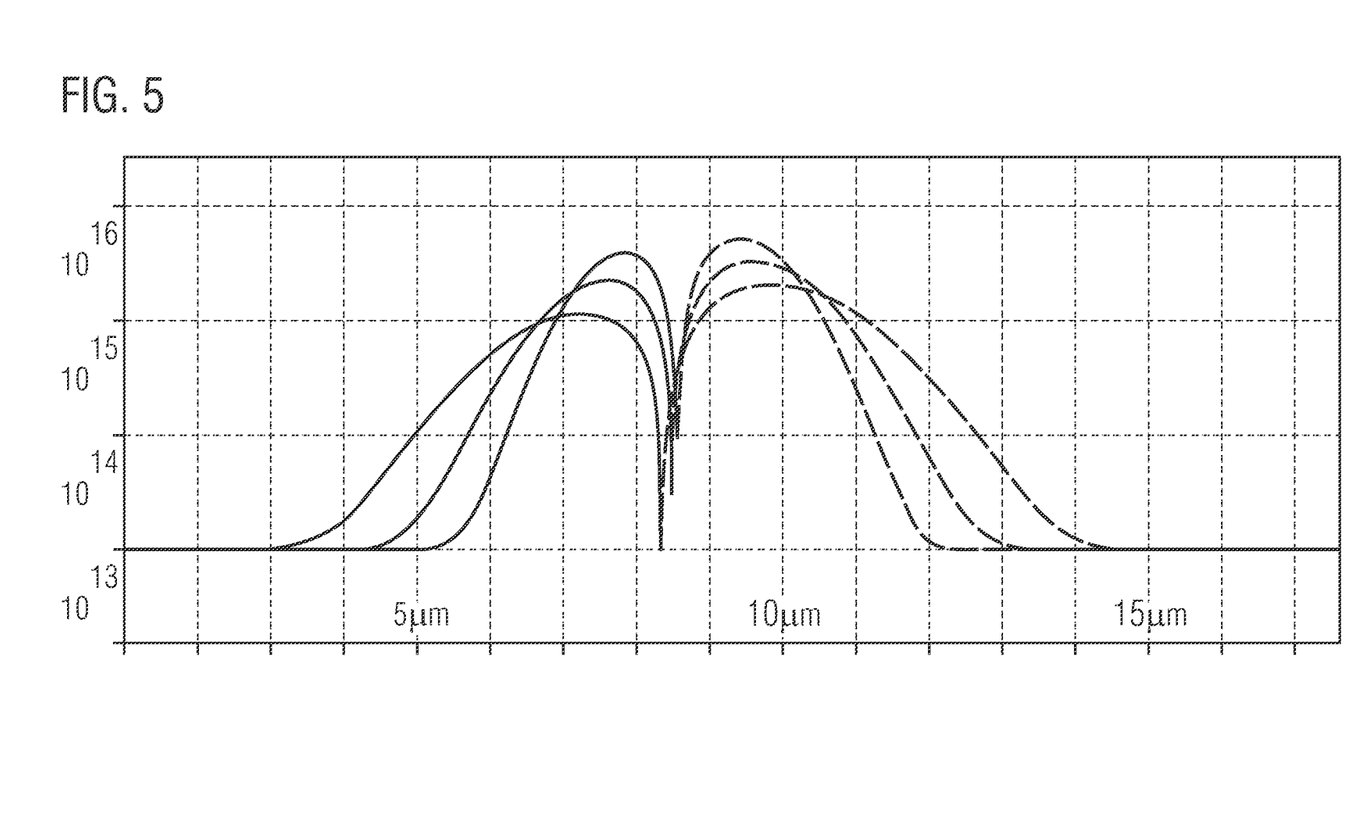
FIG. 5 shows a schematic doping profile of a semiconductor device before thinning of the semiconductor substrate.

FIG. 5 shows a schematic doping profile of a semiconductor device before thinning of the semiconductor substrate (only a part of the drift zone is shown in this figure). In comparison to the examples shown in FIGS. 3A and 3B, the example of FIG. 5 is implemented without an additional (intermediate) epitaxial layer after the first implantation but with different implantation energies. Further, the substrate surface is located at 7 µm. During the first implantation boron is implanted with a dose of $1*10^{12}$ cm$^{-2}$ at 700 keV and during the second implantation phosphorous is implanted with a dose of $1*10^{12}$ cm$^{-2}$ at 70 keV (or 50 keV). The profile with the highest peak is obtained with a temperature budget of 200 min at 1100° C., the middle peak is obtained with a temperature budget of 400 min at 1100° C. and the shallow, wide peak is obtained with a temperature budget of 800 min at 1100° C. In this example, the position of the pn-junction only moves 0.3 µm when quadrupling the diffusion time.

Figure 6:
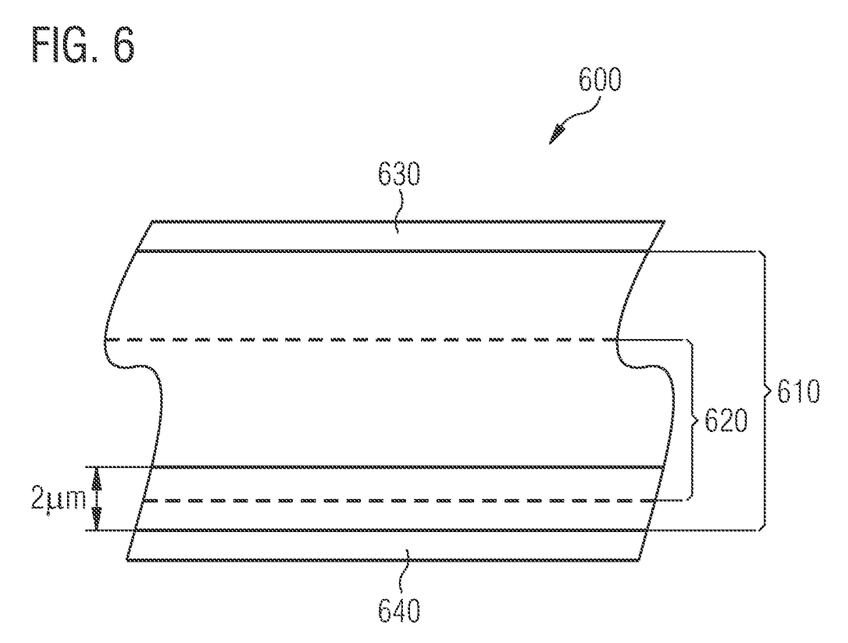
FIG. 6 shows a schematic cross section of a semiconductor device.

FIG. 6 shows a schematic cross section of a semiconductor device according to an embodiment. The semiconductor device 600 comprises at least one vertical electrical element structure formed at a semiconductor substrate 610. The at least one vertical electrical element structure comprises a doping region 620 having a second conductivity type located between a front side and a back side of the semiconductor substrate 610. Further, the doping region 620 extends vertically at least from a distance of less than 2 µm from the back side of the semiconductor substrate to a distance of more than 2 µm from the back side of the semiconductor substrate. Additionally, the semiconductor device 600 comprises at least one front side electrode structure 630 connected to the at least one vertical electrical element structure at a front side of the semiconductor substrate 610 and at least one back side electrode structure 640 connected to the at least one vertical electrical element structure at a back side of the semiconductor substrate 610. Further, a concentration of dopant atoms of a first conductivity type at a distance of 2 µm from the back side of the semiconductor substrate 610 is larger than $5*10^{13}$ cm$^{-3}$.

The increased dopant concentration of the first conductivity type may result from the incorporation of two different dopants of different conductivity type forming a pn-junction in the proximity of the interface between a non-epitaxial semiconductor substrate and an epitaxial semiconductor layer during the manufacturing of the semiconductor device. The position of the pn-junction may be very constant during the remaining manufacturing processes of the semiconductor device due to the incorporation of two different dopants. Therefore, the accuracy of the thinning of the semiconductor substrate may be improved, when using a self-aligned thinning process, which stops at the pn-junction or a depletion zone caused by the pn-junction. In this way, the reproducibility of the electrical performance of the semiconductor device may be improved.

The semiconductor substrate 610 may be mainly an epitaxial semiconductor substrate. For example, a thin non-epitaxial semiconductor portion may be located at the back side of the semiconductor substrate 610 due to the thinning during the manufacturing of the semiconductor device 600. For example, more than 90% (or more than 95% or more than 99%) of the thickness of the semiconductor substrate 610 may be epitaxial semiconductor material. Alternatively, the whole semiconductor substrate 610 is an epitaxial semiconductor substrate.

The vertical electrical element structure may be a vertical diode structure, a vertical transistor structure, a vertical field effect transistor structure or a vertical insulated gate bipolar transistor structure, for example.

The doping region 620 of the vertical electrical element structure may be or may comprise a drift region, a field stop region, a back side diode region (e.g., anode or cathode region) and/or a back side transistor region (e.g., drain region), for example.

The concentration of dopant atoms of the first conductivity type at a distance of 2 µm from the back side of the semiconductor substrate 610 within the doping region 620 of the vertical electrical element structure is larger than $5*10^{13}$ cm$^{-3}$ (or larger than $1*10^{14}$ cm$^{-3}$ or larger than $5*10^{14}$ cm$^{-3}$).

The front side electrode structure 630 and/or the back side electrode structure 640 are electrically conductive structures in contact with the semiconductor substrate and mainly comprise or consist of copper, aluminum and/or highly doped poly silicon. The front side electrode structure 630 and/or the back side electrode structure 640 may connect parts of the vertical electrical element structure (e.g., anode and/or cathode of a diode or source, drain and/or gate of a field effect transistor or an insulated gate bipolar transistor) to another electrical element structure or a contact interface (e.g., pad or back side metallization) for enabling an external contact.

The vertical electrical element structure may comprise a blocking voltage of more than 10V, more than 100 V, more than 500 V or more than 1000 V, for example. The semiconductor device may be a power semiconductor device having a breakdown voltage or blocking voltage of more than boy (e.g., a breakdown voltage of 10 V, 20 V or 50 V), more than 100 V (e.g., a breakdown voltage of 200 V, 300 V, 400V or 500V) or more than 500 V (e.g., a breakdown voltage of 600 V, 700 V, 800V or 1000V) or more than 1000 V (e.g., a breakdown voltage of 1200 V, 1500 V, 1700V, 2000V, 3300V or 6500V), for example.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g., FIG. 1 to 5) or below.

Some embodiments relate to a method for a self-adjusted thinning of epitaxy-based semiconductor wafers. According to an aspect, a method is provided, which allows thinning a substrate wafer onto which an epitaxy layer was deposited self-adjustingly and thus with a very high accuracy. For example, with IGBTs such an improved thinning may enable an improved reproducible electrical performance.

In comparison, normal (non-self-aligned) methods like grinding and etching, may be subject to variations of more than +/−3 micrometers. Some self-adjusting etching processes may be also subject to noticeable scattering, as during the epitaxial process and in particular in subsequent high-temperature processes the pn-junction between the substrate and the field-stop zone may be shifted significantly. Also the expansion of the space-charge region at a certain predetermined voltage (e.g., the boundary of the space-charge region in the p-doped region here determines the position where etching stops) may have a poor reproducibility as the doping in the substrate and in the space-charge region during overall processing may change up to the thinning process and thus also the position of the etch stop. The proposed concept may enable forming a pn-junction which has a very stable position during the manufacturing of the semiconductor device.

According to an aspect, a pn-junction in the area of transition between the substrate and the epitaxial layer deposited thereon may be generated by two ion implantations of acceptors and donors which may comprise similar doping coefficients so that a stationary pn-junction may result and simultaneously a sufficiently high intersection concentration of acceptor and donor profiles in the region of the pn-junction, so that not only a well-defined positioning of the space-charge region may result but also a relatively restricted vertical expansion of this space-charge region, for example. Here, the n-doped region may be closer to the wafer front side and the p-doped region may be closer to the wafer back side. An example of a suggested doping profile is schematically illustrated in FIG. 3A.

For example, to acquire the desired doping profile with a desired stable positioning of the pn-junction and the desired vertical course of the doping profile, e.g., an ion implantation with phosphorous atoms and an ion implantation with boron atoms are executed. Both atom types have a comparable diffusion coefficient in silicon. To achieve the desired effect, approximately equal implantation dosages may be selected. To facilitate the implantation of the doping profile aimed at, also a sufficient distance between the end-of-range of the donor and the acceptor implantation may be chosen. This may, for example, be done by choosing the implantation energy of the acceptor implantation to be significantly higher than the ion implantation energy of the donor implantation (e.g., FIG. 5). Alternatively, the acceptor implantation, in contrast to the donor implantation, may be implanted at an angle of 0° (or vice versa), so that a channeling of the implanted acceptor atoms occurs (e.g., the acceptor implantation may take place at an angle of between 5° and 10°, e.g., 7°) and thus the penetration depth may be increased. A further possibility to obtain a sufficient distance between the end-of-range of the donor and the acceptor implantation may also be to deposit a relatively thin (e.g., 1-5 micrometers thick) epitaxial layer after the acceptor implantation and then execute the donor implantation (e.g., FIGS. 3A-3C).

For example, after performing and completing the front-side processes, the back-side substrate, depending on the positioning of the pn-junction, may be removed completely or at least almost completely e.g., by a mechanical pre-thinning process (e.g., by a grinding process) and a subsequent electro-chemical etching process (e.g., contacting the n-region may take place in the area of the kerf). In some examples, afterwards an additional slight removal process may be executed to remove the remaining, very narrow and low-doped p-region (e.g., by time controlled etching). This may be unnecessary, however, as this region may not contribute much to the efficiency of the emitter after the generation of the back-side emitter. The n-region diffused into the epitaxial layer which is put together, for example, from a higher concentration of donors and a lower number of acceptors may, given a corresponding doping concentration of this region, either be integrated into an additionally incorporated stop layer (field stop region) or even form the same given a suitable dimensioning, or be removed again completely or partially by means of the additional removal act, for example.

For example, the intersection concentration, after the execution of all front side processes, may exceed e.g., some 1.E+14 or even preferably 1.E+15 cm-3 or even 1.E-16 cm-3 or even preferably 1.E+17 cm-3. The implantation dosages for the acceptors and the donors may be selected in a range between 1.E+12 cm-2 and 1-E+15 cm-2 or in a range between 1.E+13 cm-2 and 5.E+14 cm-2. The vertical distance between the end-of-ranges of the two ion implantations may e.g., be in a range between 500 nm and 5 micrometers.

The pn-transition may be in the substrate or in the epitaxial layer in case of a deposition of an additional epitaxial layer before the donor implantation. For example, the doping of the substrate may be selected relatively low in order not to noticeably influence the pn-transition, if possible.

For example, the field-stop zone may either be generated during the epitaxial processes (e.g., in this case the lower (e.g., towards the wafer back side) boundary of this field stop zone may be suitably positioned with respect to the back-thinning variants) or after the thinning process by means of proton implantation.

According to the proposed concept, a defined pn-transition may be implemented which may not or only minimally be shifted during the subsequent processes and may be in direct proximity of the transition between the substrate and an epitaxial layer deposited onto the substrate. For example, acceptors and donors with a comparable diffusion constant are implanted in the semiconductor material in a defined vertical distance that may be having approximately the same dosage. The gradients of the dopant profiles of the acceptors and donors may be selected to be sufficiently high in the area of the pn-transition to keep the expansion of the space-charge region sufficiently low at the voltage applied during the self-adjusted electro-chemical etching process, and thus also may minimize the influence of process scattering (e.g., oven temperature, process time and/or substrate doping). Thinning the substrate may be executed self-adjustedly to the pn-junction. Optionally afterwards an additional small amount of material may be removed.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   incorporating first dopant atoms of a first conductivity type into a semiconductor substrate to form a first doping region of the first conductivity type;
   forming an epitaxial semiconductor layer on the semiconductor substrate;
   incorporating second dopant atoms of a second conductivity type into the semiconductor substrate or the epitaxial semiconductor layer to form a second doping region of the second conductivity type adjacent to the first doping region so that a pn-junction is located between the first doping region and the second doping region, wherein the pn-junction has a location in a vertical distance of less than 5 µm to an interface between the semiconductor substrate and the epitaxial semiconductor layer; and
   performing a self-aligned thinning process to thin the semiconductor substrate, wherein the self-aligned thinning process is self-controlled based on the location of the pn-junction.

2. The method according to claim 1, wherein the first dopant atoms are incorporated with a dopant dose of more than $1*10^{12}$ cm$^{-2}$.

3. The method according to claim 1, wherein a dopant dose of the first dopant atoms and a dopant dose of the second dopant atoms differs by less than 10%.

4. The method according to claim 1, wherein the first dopant atoms are incorporated by a first implantation process and the second dopant atoms are incorporated by a second implantation, wherein an end of range of the first implantation process and an end of range of the second implantation are spaced apart from each other by less than 10 µm.

5. The method according to claim 1, wherein the first dopant atoms are incorporated laterally over the entire semiconductor substrate.

6. The method according to claim 1, wherein the second dopant atoms are incorporated after forming the epitaxial semiconductor layer.

7. The method according to claim 6, wherein the epitaxial semiconductor layer comprises a thickness of less than 10 μm.

8. The method according to claim 6, further comprising forming a second epitaxial semiconductor layer on the epitaxial semiconductor layer after incorporating the second dopant atoms, wherein the second epitaxial semiconductor layer comprises a thickness of more than 10 μm.

9. The method according to claim 1, wherein the second dopant atoms are incorporated before forming the epitaxial semiconductor layer.

10. The method according to claim 9, wherein the epitaxial semiconductor layer comprises a thickness of more than 10 μm.

11. The method according to claim 1, further comprising forming at least a part of a vertical transistor structure or a vertical diode structure after incorporating the second dopant atoms and before thinning the semiconductor substrate.

12. The method according to claim 11, wherein the vertical transistor structure or vertical diode structure comprises a blocking voltage of more than boy.

13. The method according to claim 1, wherein the semiconductor substrate comprises an electrical resistivity of more than 50 Ω/cm before incorporating the first dopant atoms.

14. The method according to claim 1, wherein the first dopant atoms are boron atoms or indium atoms and the second dopant atoms are phosphorus atoms.

15. The method according to claim 1, wherein performing a self-aligned thinning process comprises applying an external electrical potential to the second doping region.

16. The method according to claim 1, wherein a concentration of dopant atoms of the first conductivity type and a concentration of dopant atoms of the second conductivity type at the pn-junction is higher than $1*10^4$ cm$^{-3}$.

17. A semiconductor device comprising:
a vertical electrical element structure formed at a semiconductor substrate, wherein the vertical electrical element structure comprises a doping region having a second conductivity type located between a front side and a back side of the semiconductor substrate, wherein the doping region extends vertically at least from a distance of less than 2 μm from the back side of the semiconductor substrate to a distance of more than 2 μm from the back side of the semiconductor substrate, wherein a concentration of dopant atoms of a first conductivity type at a distance of 2 μm from the back side of the semiconductor substrate is larger than $5*10^{13}$ cm$^{-3}$;
a front side electrode structure connected to the vertical electrical element structure at a front side of the semiconductor substrate; and
a back side electrode structure connected to the vertical electrical element structure at a back side of the semiconductor substrate.

18. A semiconductor device according to claim 17, wherein a concentration of dopant atoms of the second conductivity type at a distance of 2 μm from the back side of the semiconductor substrate is larger than $5*10^{14}$ cm$^{-3}$.

19. A semiconductor device according to claim 17, wherein the doping region having the second conductivity type comprises a drift region and a field stop region of the vertical electrical element structure.

20. A semiconductor device according to claim 17, wherein the vertical electrical element structure comprises a blocking voltage of more than boy.

* * * * *

UNITED STATES PATENT AND TRADEMARK OFFICE
CERTIFICATE OF CORRECTION

PATENT NO.         : 9,911,808 B2                                Page 1 of 1
APPLICATION NO.    : 15/413579
DATED              : March 6, 2018
INVENTOR(S)        : Schulze It is certified that error appears in the above-identified patent and that said Letters Patent is hereby corrected as shown below:

In the Claims

In Column 15, Line 27, Claim 12, delete "boy" and insert --10V--.

In Column 15, Line 30, Claim 13, delete "50 $\Omega$/cm" and insert --50 $\Omega$cm--.

In Column 16, Line 4, Claim 16, delete "$1*10^4$ cm$^{-3}$" and insert --$1*10^{14}$ cm$^{-3}$--.

In Column 16, Line 35, Claim 20, delete "boy" and insert --10V--.

Signed and Sealed this
Fifth Day of June, 2018

Andrei Iancu
*Director of the United States Patent and Trademark Office*